United States Patent
Bao et al.

(10) Patent No.: US 10,325,979 B1
(45) Date of Patent: Jun. 18, 2019

(54) HIGH DENSITY AND RELIABLE VERTICAL NATURAL CAPACITORS

(71) Applicant: QUALCOMM Incorporated, San Diego, CA (US)

(72) Inventors: Junjing Bao, San Diego, CA (US); Jun Chen, San Diego, CA (US); Yangyang Sun, San Diego, CA (US); Stanley Seungchul Song, San Diego, CA (US); Giridhar Nallapati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/860,005

(22) Filed: Jan. 2, 2018

(51) Int. Cl.
*H01L 49/02* (2006.01)
*H01L 23/522* (2006.01)

(52) U.S. Cl.
CPC .......... *H01L 28/91* (2013.01); *H01L 23/5223* (2013.01)

(58) Field of Classification Search
CPC ............................ H01L 28/91; H01L 23/5223
USPC .......................................................... 257/534
See application file for complete search history.

(56) References Cited

U.S. PATENT DOCUMENTS

2002/0192980 A1* 12/2002 Hogle ................... C23C 16/401
  438/778
2012/0007214 A1* 1/2012 Chu ..................... H01L 23/5223
  257/532

* cited by examiner

*Primary Examiner* — Victoria K. Hall
(74) *Attorney, Agent, or Firm* — Qualcomm Incorporated

(57) ABSTRACT

Aspects of the disclosure are directed to an integrated circuit. The integrated circuit may include a substrate, a first group of metal layers including a plurality of first fingers over the substrate, wherein the first fingers are formed without a via. The integrated circuit may further include a second group of metal layers including a plurality of second fingers over the first group of metal layers, wherein the second fingers are formed with vias, and wherein the first and the second group of metal layers are formed by a processing technology node of 7 nm or below.

23 Claims, 3 Drawing Sheets

HIGH DENSITY AND RELIABLE VERTICAL NATURAL CAPACITORS

BACKGROUND

Field

Aspects of the present disclosure relate generally to integrated circuits and, more particularly, to integrated circuits including vertical natural capacitors (VNCAPs).

Background

Integrated circuits are commonly used in electronic devices including cellular phones, video cameras, portable music players, printers, computers, location based devices, etc. Integrated circuits may include a combination of active devices, passive devices, and their interconnections. On-chip capacitors are critical components of integrated circuits. These capacitors are used for a variety of purposes including bypass and capacitive matching to analog and radio frequency integrated circuit applications. Vertical natural capacitors (VNCAPs) with inter-digitated metal structures connected by vias are often used for advanced complementary metal-oxide semiconductor (CMOS) technologies because conventional planar capacitors such as metal-insulator-metal (MIM) capacitors require extra process steps and masks. At small nodes such as 7 nm and below, there is concern with stress migration (SM) fails in vias connecting the inter-digitated structures or fingers of the VNCAP and chip-package interaction (CPI) fails in the ultra low-k (ULK) materials close to ULK and oxide interfaces. Thus, there is a need for a high density and reliable VNCAP for process nodes of 7 nm and below.

SUMMARY

The following presents a simplified summary of one or more embodiments to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

One described embodiment comprises a method of manufacturing an integrated circuit. The method may include providing a substrate, forming a first group of metal layers including a plurality of first fingers over the substrate, the first fingers being formed without vias, and forming a second group of metal layers including a plurality of second fingers over the first group of metal layers, the second fingers formed with vias, wherein the first and the second group of metal layers are formed by a processing technology node of 7 nm or below.

Another described embodiment comprises an integrated circuit. The integrated circuit may include a substrate, a first group of metal layers including a plurality of first fingers over the substrate, wherein the first fingers are formed without a via. The integrated circuit may further include a second group of metal layers including a plurality of second fingers over the first group of metal layers, wherein the second fingers are formed with vias, and wherein the first and the second group of metal layers are formed by a processing technology node of 7 nm or below.

These and other embodiments of the invention will become more fully understood upon a review of the detailed description, which follows. Other embodiments of the invention will become apparent to those of ordinary skill in the art, upon reviewing the following description of specific, exemplary embodiments of the invention in conjunction with the accompanying figures.

DETAILED DESCRIPTION

The detailed description set forth below, in connection with the appended drawings, is intended as a description of exemplary embodiments and is not intended to represent the only embodiments in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
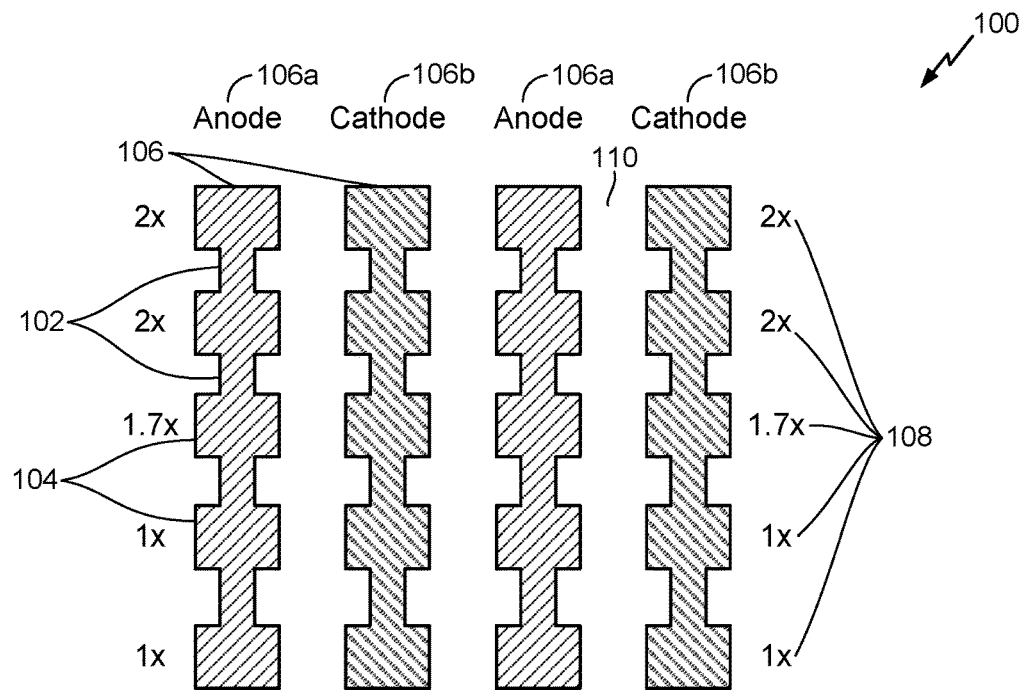
FIG. 1 illustrates a cross-section view of a vertical natural capacitor (VNCAP) of the prior art.

FIG. 1 illustrates a cross-section view of a vertical natural capacitor (VNCAP) 100 of the prior art. VNCAP 100 may be formed, e.g., in back-end-of-the-line metal layers. One method of increasing capacitance density of VNCAP 100 is to include vias 102 between interpenetrating comb structures of conductive fingers 104 to provide additional vias to metal coupling capacitance. VNCAP 100 may comprise a plurality of charge plate structures 106. Each charge plate structure 106 includes conductive fingers 104 on a plurality of corresponding respective metal layers 108 and vias 102 that electrically connect together conductive fingers 104 on adjacent metal layers 108 (e.g., 1×, 1.7×, 2×, where x is the minimum reproducible dimension permitted by the current processing technology node). Each metal layer 108 may further include conductor strips (not shown) that electrically connect anode charge plate structures 106a, and conductor strips that electrically connect cathode charge plate structures 106b. The resulting structure is a dual-comb structure in which opposite polarity charge plate structures 106a and 106b are interdigitated with one another. VNCAP 100 is encased in a low-k material 110, which has a dielectric constant k of about 3.0.

As processing nodes reach 7 nm and below, there is concern with stress migration (SM) fails in vias 102 connecting the interdigitated conductive fingers 104 of VNCAP 100. More specifically, stress migration occurs when tensile stress in copper (Cu) compels vacancy to migrate to a specific place, usually around the vias, leading to via bottom voids. For example, single small vias connected with wide lines are likely to suffer SM fails. To mitigate or avoid SM fails, larger via critical dimension (CD) or multiple vias have been used at the intersection of metal layers. At 7 nm and below, there is no room to add multiple vias on metal fingers.

Figure 2:
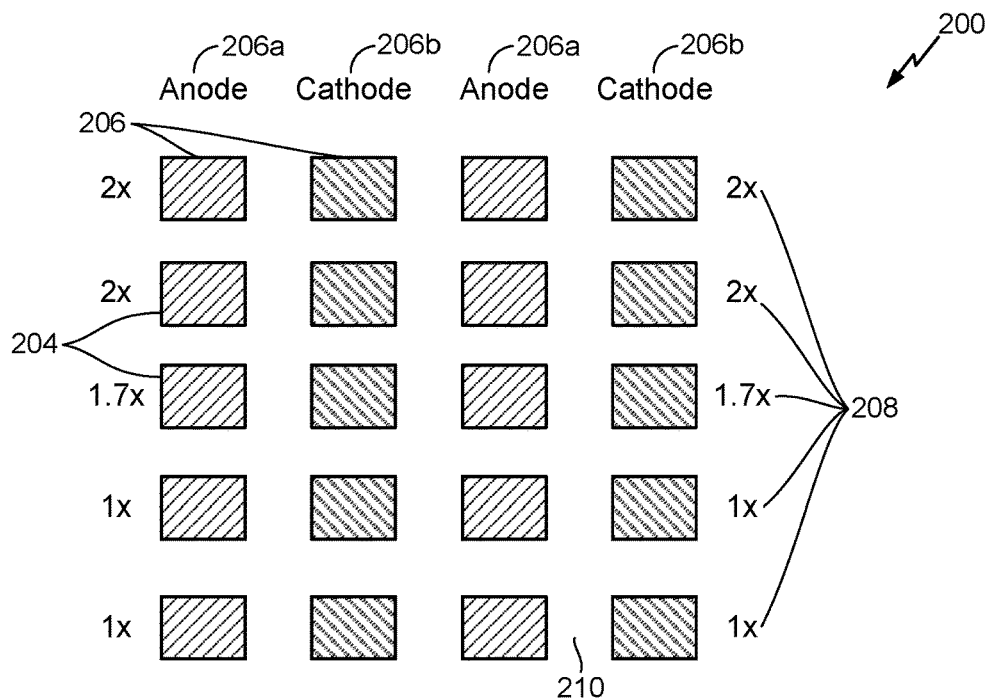
FIG. 2 illustrates a cross-section view of another VNCAP of the prior art.

FIG. 2 is a cross-section view of a vertical natural capacitor (VNCAP) 200 of the prior art. In particular, VNCAP 200 has been proposed by foundries for process node of 7 nm and below to overcome the problem of stress migration. As compared to VNCAP 100, VNCAP 200 eliminates vias to address the problem of stress migration. VNCAP 200 comprises a plurality of charge plate structures 206, each of the plurality of charge plate structures 206 includes a plurality of conductive fingers 204 on a plurality of corresponding respective metal layers 208 (e.g., 1×, 1.7×, 2×, where x is the minimum reproducible dimension permitted by the current processing technology node). Each metal layer 208 further includes conductor strips (not shown) that electrically connect anode charge plate structures 206a, and conductor strips that electrically connect cathode charge plate structures 206b. The resulting structure is a dual-comb structure in which opposite polarity charge plate structures 206a and 206b are interdigitated with one another. VNCAP 200 is encased in a low-k material 210, which has a dielectric constant k less than 3.0. By removing vias between interpenetrating comb structures of conductive fingers, VNCAP 200 addresses the problem of stress migration as compared to VNCAP 100 of FIG. 1 but introduces additional problems including, e.g., lower capacitance, mechanically weaker structure, and higher chip-package interaction (CPI) risk. More specifically, CPI fails often occur in ultra low-k (i.e., dielectric constant of 2.6 or less) materials close to weak interfaces between ultra low-k (ULK) and oxide layers. That is, ULK materials introduce porosity for lower k value but result in weak mechanical strength. In chip attachment or board tests, ULK delamination may occur close to ULK and oxide interfaces that then spread into weak ULK. Crack may also occur for non-via regions without metal pillars.

Figure 3A:
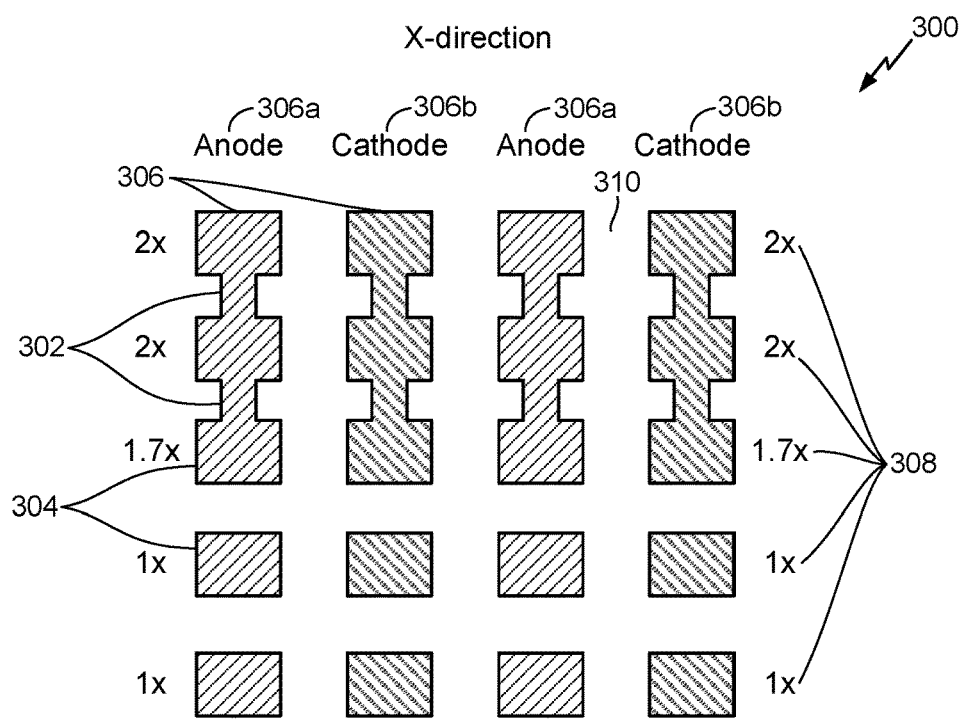
FIGS. 3A-3B illustrate cross-section views of a VNCAP in accordance to one embodiment of the invention.
Figure 3B:
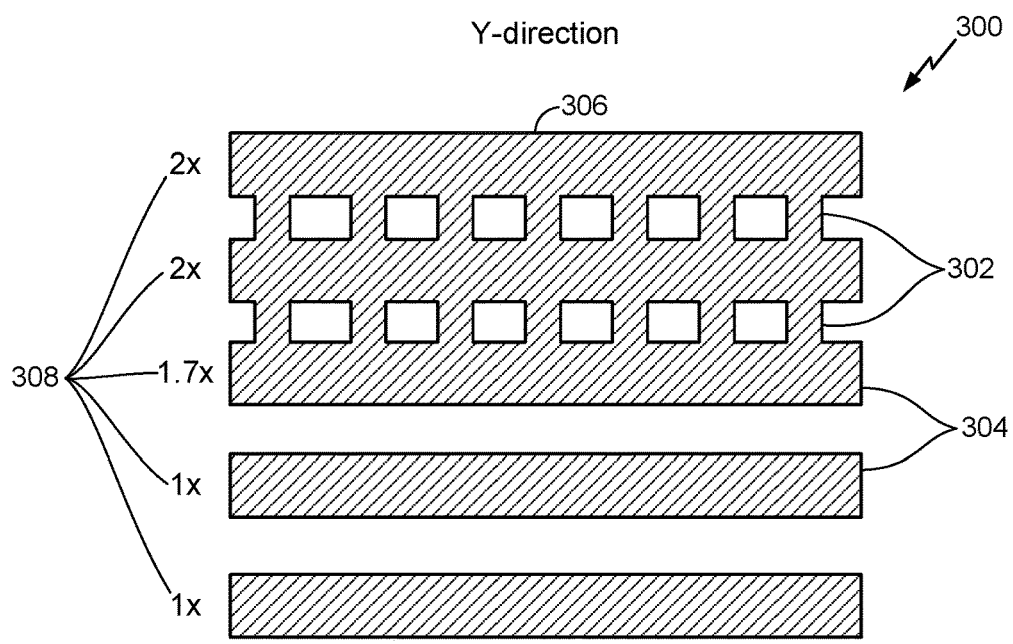

FIG. 3A illustrates a cross-section view of a vertical natural capacitor (VNCAP) 300 in the X-direction, and FIG. 3B illustrates a cross-section view of VNCAP 300 in the Y-direction in accordance to one embodiment of the invention. VNCAP 300 may be formed, e.g., in back-end-of-the-line metal layers. In the illustrated embodiment, density of VNCAP 300 is increased by providing vias 302 between interpenetrating comb structures of conductive fingers 304 of upper metal layers as further explained below.

VNCAP 300 may comprise a plurality of charge plate structures 306. Each charge plate structure 306 may include conductive fingers 304 on a plurality of corresponding respective metal layers 308 and vias 302 that electrically connect together conductive fingers 304 on adjacent metal layers 308. To overcome the stress migration problem for process nodes of 7 nm and beyond, vias 302 are used only for upper metal layers (e.g., layers greater than 1× such as 1.7×, 2×, etc., where x is the minimum reproducible dimension permitted by a selected processing technology node) and not for lower layers (e.g., 1× layers). More specifically, metal layers 308 formed above the 1× layer(s) (e.g., at 1.7×, 2×, and/or greater than 2× levels) can be formed with vias 302. At the upper metal layers, vias 302 may have larger critical dimension (CD) to minimize stress migration (SM) fails. Each metal layer 308 may further include conductor strips that electrically connect anode charge plate structures 306a, and conductor strips that electrically connect cathode charge plate structures 306b together. The resulting structure is a dual-comb structure in which opposite polarity charge plate structures 306a and 306b are interdigitated with one another. The 2× layer(s) may be encased in an ultra low-k material 310, which has a dielectric constant k of about 2.6 or less for faster on-chip signal propagation in the routing layers. The invention overcomes SM and CPI fails and maximizes capacitance as technology advances down to 7 nm and beyond by removing the vias in the lower metal layers that may cause via bottom voids, and keeping the vias in the upper layers to connect the interdigitated conductive fingers and provide high capacitance.

Figure 4A:
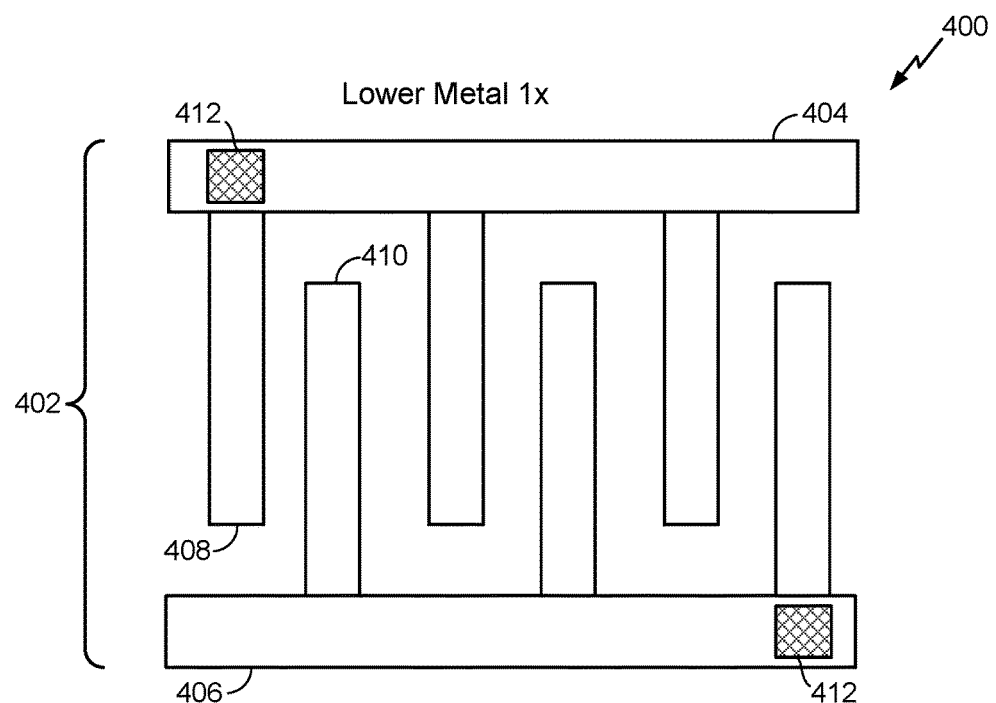
FIGS. 4A-4B illustrate top views of a VNCAP in accordance to one embodiment of the invention.
Figure 4B:
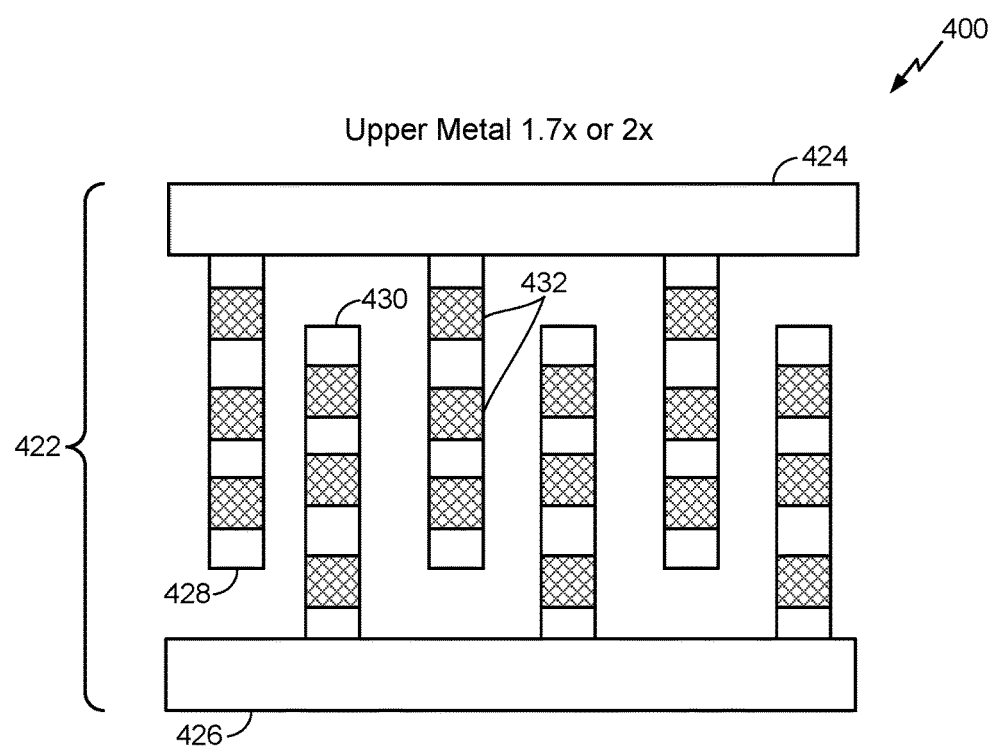

FIG. 4A illustrates a top view of VNCAP 400 for lower metal layer 1×, and FIG. 4B illustrates a top view of VNCAP 400 for upper metal layer(s) 1.7×, 2×, and/or greater than 2× in accordance to one embodiment of the invention. VNCAP 400 may include a hierarchical VNCAP structure formed above a substrate (not shown). The substrate may be an individual chip diced from a semiconductor wafer. Active and/or passive device structures, such as front-end-of-line circuitry, and their interconnections may be formed on the substrate. VNCAP 400 may be formed by back-end-of-the-line (BEOL) metal layers, such as metal layers 1×, 1.7×, 2×, etc., as explained above. The metal layers within each group are substantially parallel with each other and the substrate. FIG. 4A illustrates a first metal layer 402 including a first interconnect 404, a second interconnect 406, a first finger 408, a second finger 410, and a plurality of vias 412 formed in first interconnect 404 and second interconnect 406. First interconnect 404 and second interconnect 406 may be terminal lines for first finger 408 and second finger 410, respectively. Terminal lines may be vertically connected by vias 412. Vias 412 may be vias with critical dimensions (CD) larger than dimensions specifying any applicable ground rule and/or a via array with via counts ≥2. First interconnect 404 and second interconnect 406 may vary in width and can be wider or narrower than finger 408 and second finger 410 depending on the design specifications of VNCAP 400.

Referring to FIG. 4B, there is shown a top view of a second metal layer 422 including a first interconnect 424, a second interconnect 426, a first finger 428, a second finger 430, and a plurality vias 432 formed in first finger 428 and second finger 430. Second metal layer 422 may further include metal lines (not shown) having greater thickness than metal lines in first metal layer 402. It should be noted that one or more of first metal layer 402, e.g., a first metallization layer (M1), a second metallization layer (M2), a third metallization layer (M3), etc., and one or more of second metal layer 422, e.g., a fifth metallization layer (M5), a sixth metallization layer (M6), and/or a seventh metallization layer (M7), etc., can be vertically stacked to form a VNCAP structure with a desired capacitance value. Furthermore, second metal layer 422 is above first metal layer 402 and can be in electrical contact with a top layer of first metal layer 400 through vias 412. Similarly, vias 432 can electrically interconnect adjacent layers (e.g., M5 and M6) of second metal layer 422. Fingers 428 and 430 may be parallel and/or perpendicular to each other between two consecutive layers. Finger width/space (W/S) may be approximately 40 nm or less. Vias 432 may be formed in at least two topmost metal layers surrounded by ULK materials with a minimum density of 0.1%.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another-even if they do not directly physically touch each other. For instance, a first die may be coupled to a second die in a package even though the first die is never directly physically in contact with the second die.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A method of manufacturing an integrated circuit, comprising:
    providing a substrate;
    forming a first group of metal layers including a plurality of first fingers over the substrate, the first fingers being formed without vias; and
    forming a second group of metal layers including a plurality of second fingers over the first group of metal layers, the second fingers formed with vias,
    wherein the first and the second groups of metal layers are formed by a processing technology node of 7 nm or below,
    wherein the processing technology node has width/space (W/S) of approximately 40 nm or less utilized in both the first and the second groups metal layers.

2. The method of claim 1, further comprising interconnecting the first group of metal layers and the second group of metal layers.

3. The method of claim 1, further comprising interconnecting the second group of metal layers.

4. The method of claim 3, wherein the second group of metal layers are electrically interconnected through the vias on the second fingers.

5. The method of claim 4, further comprising forming the vias in part of and/or all of the second fingers of the second group of metal layers.

6. The method of claim 4, further comprising forming the vias in the second fingers of at least two topmost metal layers having a minimum density of 0.1%.

7. The method of claim 1, wherein the first group of metal layers comprises 1× metal layers where x is the minimum reproducible dimension permitted by the processing technology node.

8. The method of claim 1, wherein the first group of metal layers comprise metal fingers that are parallel or perpendicular to each other between two consecutive layers.

9. The method of claim 1, wherein the second group of metal layers comprises metal layers formed above 1× metal layers where x is the minimum reproducible dimension permitted by the processing technology node.

10. The method of claim 1, wherein the second group of metal layers comprise metal fingers that are parallel and/or perpendicular to each other between two consecutive layers.

11. The method of claim 9, wherein the second group of metal layers comprises 1.7×, 2×, and/or greater than 2× metal layers.

12. The method of claim 11, further comprising forming the 2× or greater than 2× metal layers in an ultra low-k material with dielectric constant 2.6 or less.

13. An integrated circuit, comprising:
    a substrate;
    a first group of metal layers including a plurality of first fingers over the substrate, the first fingers formed without a via;
    a second group of metal layers including a plurality of second fingers over the first group of metal layers, the second fingers formed with vias; and
    an interconnect to electrically connect the first group of metal layers and the second group of metal layers,
    wherein the first and the second groups of metal layers are formed by a processing technology node of 7 nm or below, and
    wherein the processing technology node has width/space (W/S) of approximately 40 nm or less utilized in both the first and the second groups of metal layers.

14. The integrated circuit of claim 13, further comprising an interconnect to electrically connect adjacent layers of the second group of metal layers.

15. The integrated circuit of claim 14, wherein the interconnect includes the vias on the second fingers.

16. The integrated circuit of claim 15, wherein the vias are formed in part of and/or all of the second fingers of the second group of metal layers.

17. The integrated circuit of claim 15, wherein the vias are formed in the second fingers of at least two topmost metal layers having a minimum density of 0.1%.

18. The integrated circuit of claim 13, wherein the first group of metal layers comprises 1× metal layers where x is the minimum reproducible dimension permitted by the processing technology node.

19. The integrated circuit of claim 13, wherein the first group of metal layers comprise metal fingers that are parallel and/or perpendicular to each other between two consecutive layers.

20. The integrated circuit of claim 13, wherein the second group of metal layers comprises metal layers formed above 1× metal layers where x is the minimum reproducible dimension permitted by the processing technology node.

21. The integrated circuit of claim 13, wherein the second group of metal layers comprise metal fingers that are parallel or perpendicular to each other between two consecutive layers.

22. The integrated circuit of claim 21, wherein the second group of metal layers comprises 1.7×, 2×, and/or greater than 2× metal layers, where x is the minimum reproducible dimension permitted by the processing technology node.

23. The integrated circuit of claim 22, further comprising forming the 2× metal or greater than 2× metal layers in an ultra low-k material with dielectric constant 2.6 or less.

* * * * *